United States Patent [19]
Ogura et al.

[11] Patent Number: 5,092,937
[45] Date of Patent: Mar. 3, 1992

[54] PROCESS FOR TREATING SEMICONDUCTORS

[75] Inventors: Mototsugu Ogura, Nara; Keiichi Kagawa, Hirakata; Yuichi Hirofuji, Neyagawa, all of Japan

[73] Assignee: Matsushita Electric Industrial Co., Ltd., Osaka, Japan

[21] Appl. No.: 552,112

[22] Filed: Jul. 13, 1990

[30] Foreign Application Priority Data

Jul. 19, 1989 [JP] Japan .................................. 1-186493

[51] Int. Cl.$^5$ ............................................... B08B 3/08
[52] U.S. Cl. ........................................ 134/30; 134/3; 134/37
[58] Field of Search ............................... 134/3, 30, 37

[56] References Cited

U.S. PATENT DOCUMENTS

| | | | |
|---|---|---|---|
| 2,871,110 | 1/1959 | Stead | 134/3 |
| 4,132,567 | 1/1979 | Blackwood | 134/30 |
| 4,519,846 | 5/1985 | Aigo | 134/30 |

OTHER PUBLICATIONS

Hirofuji et al., "Orientation Dependence of Crystal Defects Formation in Si Molecular Beam Epitaxy," J. Vac. Sci. Technol., B5(1), pp. 10–14, Jan./Feb. 1987.

*Primary Examiner*—Theodore Morris
*Assistant Examiner*—Zeinab El-Arini
*Attorney, Agent, or Firm*—Stevens, Davis, Miller & Mosher

[57] ABSTRACT

Semiconductors are treated with such surface-treating solutions as ultra-pure water, dilute hydrofluoric acid and an organic solvent and then subjected to removal of the surface-treating solutions remaining on the surface of the semiconductor in an inert gas atmosphere of high purity while contacting the surface of the surface-treated semiconductor only with the inert gas of high purity, whereby contamination with impurities on atom level from the atmosphere can be prevented.

2 Claims, 2 Drawing Sheets

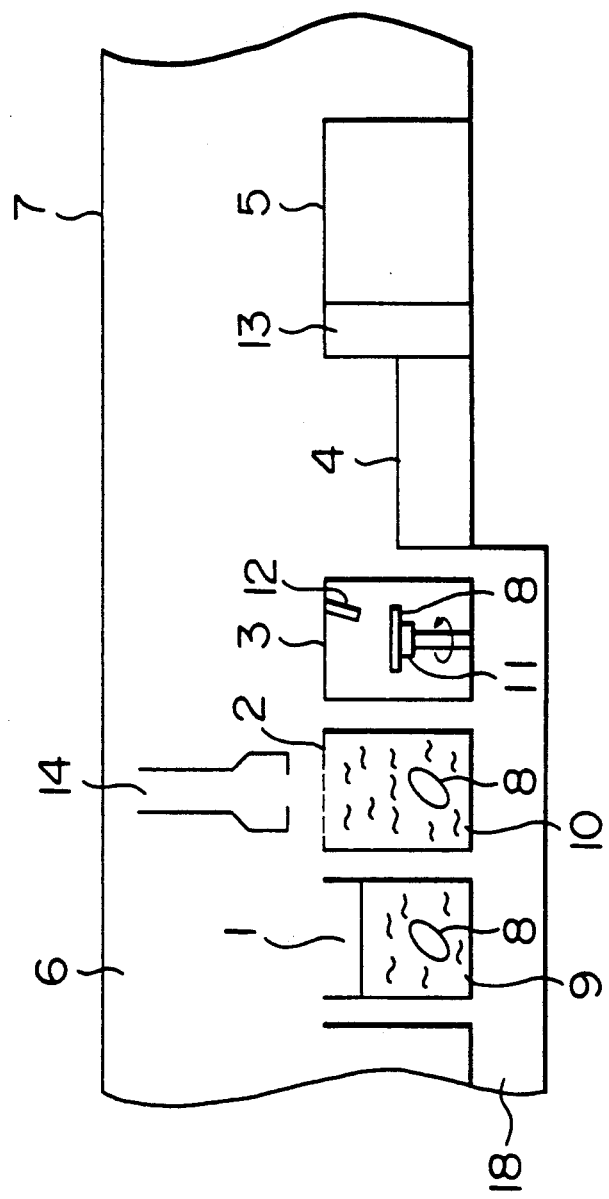

PROCESS FOR TREATING SEMICONDUCTORS

BACKGROUND OF THE INVENTION

1) Field of the Invention

This invention relates to a process for treating semiconductor wafers for producing Si-VLSI or compound semiconductor devices of high performance.

2) Prior Art

Generally, in producing ultra LSI, devices ultra-pure water is used in the surface cleaning process for the semiconductor wafers. The ultra-pure water is so low in content of impurity ions that the specific resistivity is not only higher than 18 M$\Omega$cm, but also the water is completely free of substances, which seem detrimental to preparation of the devices, such as particulate matter, organic matter, bacteria, dissolved oxygen, etc. After cleaning with the ultra-pure water, the semiconductor wafers are transferred through the atmosphere in a clean room to a wafer drier, and dried. In a step of removing oxide films from the surfaces of semiconductor wafers by dipping the wafers in an etching solution such as dilute hydrofluoric acid, etc., the etched wafers are dipped in a water washing tank successive to the etching tank right after the etching, and the etching solution remaining on the surfaces of the wafers are is diluted and removed by ultra-pure water supplied thereto.

Hydrofluoric acid having an ultra-high purity, i.e. particularly contents of impurities being reduced to a possible minimum limit for electronic industry purposes, is generally used for the removal of oxide films from the surfaces of semiconductor wafers, where impurities and particles are given a particularly keen attention and thus hydrofluoric acid for use in the etching is subjected to ultra-fine filtration, etc. Hydrofluoric acid is inevitably so expensive that it is repeatedly used by storing it in the etching tank.

However, in the conventional method an ultra-pure water film remains on the wafer surface, as attached thereto, when the wafer is picked up from the ultra-pure water to transfer it to the wafer drier after the cleaning with the ultra-pure water, and thus it is necessary to transfer the wafer through the atmosphere. It has been found that the impurities existing in the atmosphere dissolve into the ultra-pure water film remaining on the wafer surface, as attached thereto, to contaminate the wafer surface. That is, in spite of the cleaning with ultra-pure water, that is, water of very high purity, the above-mentioned phenomenon is equal to attachment of atmospherically contaminated water to the wafer surface in the course of transfer of the wafer to the drying step after cleaning with ultra-pure water, and this is a source of wafer surface contamination. For example, in case of high density VLSI of 64 Mbi or more, the gate oxide film has a thickness of not more than about 100 Å and the presence of a trace amount of contamination during the oxidation is a cause for deterioration of device characteristics such as deterioration of gate oxide film, etc., or a decrease in fabrication yield.

Generally, a clean room atmosphere freed from particles to a very high degree is used, but this atmosphere contains gas molecules of carbon dioxide gas exhaled from workers or hydrogen fluoride, nitrogen oxide, etc. emitted from hydrofluoric acid, nitric acid, etc. used in the clean room. These gas molecules chemically react with metallic parts used in an air-conditioner, etc., or with boron, etc. contained in Pyrex materials on the material surface together with water vapor in the atmosphere to form such molecules as metal salts, which contaminate the clean room atmosphere. Generally, these impurity molecules in the clean room atmosphere are highly water-soluble, and when the wafers are transferred through the clean room atmosphere while retaining water films as attached to the wafer surfaces after the cleaning with ultra-pure water, the impurity molecules dissolve into the wafer films from the clean room atmosphere to cause a surface contamination.

The surface contamination gives rise to various problems. For example, the specific resistance of ultra-pure water is lowered to about 12 M$\Omega$cm by mere contact of ultra-pure water with the impurities-contaminated atmosphere, thereby instantaneously absorbing carbon dioxide molecules into the ultra-pure water from the atmosphere. Experimental results of Si epitaxial growth show that carbon contamination, which seems to be due to adsorption of carbon dioxide molecules, has been detected on the wafer surfaces in transfer from the cleaning step to the drying step to increase crystal defects of expitaxially grown film [Y. Hirofuji and Naoto Matsumoto; J. Vac. Sci. Technol. B5 (1), pp. 10–14, Jan/Feb (1987)].

Experimental results of polycrystalline Si laser recrystallization show that boron compounds have been deposited on the wafer surfaces from the atmosphere in the cleaning step before polycrystal deposition and after the drying step, and recrystallized semiconductor thin films have turned p-type, making it difficult to control the threshold voltage of MOS transistor formed on the crystal [Y. Itoh et al; Prelecture Summaries of No. 37 Meeting of Oyobutsuri Kankei Rengo-gakakai (Society of Applied Physics-related Sciences), Part 2, page 620 (1990) 3a-SC-4].

Furthermore, particularly when a wafer surface-treating solution destined for repeated use such as dilute hydrofluoric acid is preserved in the atmosphere, the impurities dissolve into the solution from the atmosphere, as mentioned before, and the impurity concentration of the solution increases with time. When the wafer surfaces are treated with such a treating solution, impurities are adsorbed also on the wafer surfaces in accordance with the impurity concentration of the solution. Particularly in case of dilute hydrofluoric acid, the wafer surfaces in an oxide film-free state are highly active in the solution, and thus special attention must be paid to the adsorption of impurities. Even if the wafer surfaces are hydrophobic, the surfaces of wafers withdrawn from the etching solution are very liable to adsorb the impurities from the atmosphere, and thus wafer surface contamination from the atmosphere takes place until the wafers are dipped in a water washing tank filled with ultra-pure water to dilute and remove the etching solution remaining on the wafer surfaces.

Such phenomena occur not only with dilute hydrofluoric acid or ultra-pure water, but also with such cleaning solutions as organic solvents, etc., because the impurities of the atmosphere likewise dissolve into the organic solvents, etc., causing a wafer surface contamination. The surface contamination has a larger influence upon the characteristics of semiconductor devices and also cause a decrease in the yield in the production process. Thus, the surface contamination is a very serious problem against recent requirements of semiconductor devices, such as higher performance, higher density and smaller size.

SUMMARY OF THE INVENTION

An object of the present invention is to provide a process for treating semiconductor wafers to prevent deposition of impurities onto semiconductor wafer surfaces in the cleaning step, the drying step and the transfer step therebetween, thereby solving the above-mentioned problems.

That is, according to the present invention, semiconductors are treated with treating solutions, for example, dilute hydrofluoric acid of high purity, ultra-pure water, organic solvents of high purity, etc. or with their vapors in an inert gas atmosphere of high purity without any contact of Si or compound semiconductor surfaces with the atmosphere or atmospherically contaminated treating solutions, and transferred between these steps in an inert gas atmosphere of high purity. The surface-cleaning treatment of semiconductors principally means removal of parts of semiconductor itself, oxide films or nitride films existing in some region on the surface sides or back sides of semiconductor wafers or on the whole surfaces thereof with an etching solution to expose a desired semiconductor region and also means removal of the etching solutions or contamination remaining on the wafer surfaces with ultra-pure water, or cleaning of the wafer surfaces with an organic solvent of high purity and further removal of the treating solutions and drying of the wafer surfaces.

According to the present invention, the wafers are transferred through an inert gas atmosphere such as high purity nitrogen after cleaning with ultra-pure water without any contact with the atmosphere, and subjected to high speed spinning in the inert gas atmosphere of high purity or inserted in isopropyl alcohol vapors of high purity to replace the ultra-pure water with isopropyl alcohol, and then the wafers are gradually picked up from the isopropyl alcohol vapors to dry the wafer surfaces. To this end, it is necessary to shield the surface of water-cleaning tank, the inside of the wafer dryer, inlets and passage of wafers with an inert gas of high purity. In case of dilute hydrofluoric acid, an inert gas of high purity such as nitrogen is supplied to the surface of dilute hydrofluoric acid to shield the dilute hydrofluoric acid from any contact with the atmosphere. Ultra-pure water or inert gas to be used for this purpose must be of ultra-high purity, as already explained before.

Furthermore, a wafer can be placed on a spinner in a vessel filled with an inert gas of high purity and the etching solution kept to a high purity or ultra-pure water can be supplied to the wafer surface while spinning the wafer to conduct etching or cleaning treatment of wafer surface, and then supply of the etching solution or ultra-pure water can be discontinued. Then wafer can be subjected to high speed spinning to dry the wafer. In that case it is needless to say that all the treating solutions are prevented from any contact with the atmosphere to avoid dissolution of impurities into the treating solutions from the atmosphere.

The function of the present invention will be explained below.

In the present invention, the semiconductor wafers have no chance to contact the atmosphere containing impurities or contaminated treating solutions after the semiconductor wafers have been treated with the surface-treating solutions of ultra-high purity, and thus contamination of the wafer surfaces due to dissolution of impurities in the treating solutions can be completely prevented. Deposition of the impurities to the wafer surfaces from the atmosphere occurs mainly due to the contact with treating solutions containing impurities, and thus contamination with impurities can be substantially overcome by preventing the treating solutions themselves or the treating solutions remaining on the wafer surfaces from any contamination with impurities during the transfer of wafers.

When further treating steps successive to the drying step require a high degree of purification, deposition of impurities on the dried wafer surfaces from the atmosphere can be completely prevented by transferring the wafers from one step to another through the inert gas atmosphere of high purity after the cleaning and drying, while preventing the wafers from any contact with the atmosphere. Such interstep transfer is very effective for prevention of adsorption of impurities onto the wafer surfaces, on which the highly active semiconductor is exposed by removal of the oxide film from, for example, Si wafer and which are in such a state to readily adsorb impurities from the atmosphere in contact during the transfer from, for example, the etching step to the ultra-pure water cleaning step. At the same time, contamination of treating solutions such as dilute hydrofluoric acid with impurities can be prevented by shielding the surfaces of the treating solutions with an inert gas of high purity, and also contamination of the wafer surfaces with impurities in the treating solution can be prevented thereby. That is, dissolution of impurities into the treating solutions can be prevented by preventing the treating solution from any contact with the atmosphere to keep a high purity of the treating solution. In the present invention, such effects as deterioration prevention of finer VLSI devices, an increase in the production yields, etc. can be obtained.

BRIEF DESCRIPTION OF THE DRAWINGS

FIG. 1 is a schematic view showing one embodiment the present invention.

PREFERRED EMBODIMENTS OF THE INVENTION

Figure 2A:
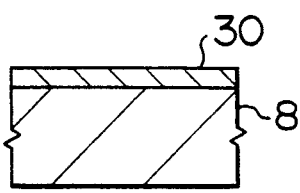
FIG. 2A to FIG. 2E show process steps of treating a semiconductor wafer according to further embodiments of the present invention, as viewed cross-sectionally.

It is an essential point of the present invention to shield the semiconductor wafer passage and the surfaces of treating solutions with an inert gas of high purity in the process for treating semiconductors so as not to bring the highly active surfaces of semiconductor wafers right after the treatment and the treating solutions to be supplied to the surfaces of semiconductor wafers into any contact with the atmosphere.

One embodiment of the present invention will be explained below, referring to FIG. 1 showing one example of a series of steps of treating semiconductor wafers.

As shown in FIG. 1, a process for treating semiconductor wafers comprises a semiconductor-treating (or oxide film-removing) section 1, a semiconductor surface-cleaning section 2, a semiconductor-drying section 3, a semiconductor transfer section 4, a semiconductor surface-treating section 5 by, for example, sputtering deposition, gate oxidation, vapor phase deposition, etc., and a clean tunnel 7 in a shape so as to house all these sections and filled with an inert gas 6 of high purity, such as nitrogen, argon, etc.

The semiconductor-treating section 1 has a treating (etching) bath 9 containing a treating (etching) solution 5 composed of dilute hydrofluoric acid. The surface of the treating solution is completely shielded with an inert gas of high purity, composed of nitrogen, and there is no room for contacting any other impurities than the inert gas of high purity with the treating solution.

The semiconductor-cleaning section 2 has a water rinse bath 10 containing a cleaning solution composed of ultra-pure water. The ultra-pure water is supplied to the water rinse bath 10 at the bottom and discharged therefrom at the top, and the ultra-pure water in contact with the semiconductor wafer 8 is never brought in contact also with the nitrogen gas shielding the water rinse bath 10.

The semiconductor drying section 3 has a wafer support 11 with a spinning mechanism as a drier and the space around the support 11 is filled with a nitrogen gas of high purity. These etching, cleaning and drying steps are usually carried out in a continuous manner, and by providing a clean tunnel 7 and a transfer means 14 that transfers the semiconductor wafer 8 through the clean tunnel 7, a chance to contact the semiconductor 8 with the atmosphere containing impurities other than the inert gas 6 of high purity can be eliminated from the clean tunnel 7 during the transfer of semiconductor wafer 8 from the oxide film-removing section 1 to the semiconductor cleaning section 2 or from the semiconductor cleaning section 2 to the semiconductor drying section 3. The transfer means 14 is of low dust generation type usually used in the conventional cleaning means, etc. and no special design is required for installing the transfer means in the clean tunnel.

Components of treating solutions such as hydrogen fluoride gas and water vapor are volatilized or evaporated from the treating bath 9 in the oxide film-removing section 1 or the water rinse bath 10 in the water cleaning section 2, and thus it is necessary to prevent a decrease in the purity of the highly pure inert gas in the clean tunnel 7. In this embodiment, to this end, a ventilator 18 is provided around the treating bath 9 and the water rinse bath 10 to prevent diffusion of the volatilized or evaporated components throughout the clean tunnel 7. A ventilator 18, which is of such a type as to aspirate the vapors generated from a chemical treating bath in the ordinary wet bench, is satisfactory for the present purpose. The ventilator 18 is also provided around the water rinse bath 10 to aspirate water vapor generated from the water rinse bath 10.

When a film such as an insulator film or a metallic or intermetallic compound film is formed on the wafer surface after the cleaning and drying, for example, by vapor phase growth, sputtering or gate oxide film formation, impurities remaining on the interface between the formed film and the wafer surface may give a large influence upon the device characteristics.

Crystal growth of compound semiconductor such as GaAs or ZnS on a Si wafer whose future application to new complex, multi-functional devices is now attracting attenuation, will be explained below.

In FIG. 1, a semiconductor wafer 8 is dipped in an etching solution composed of dilute hydrofluoric acid filled in the treating bath 9 in the oxide film-removing section 1 at room temperature to remove parts or the whole of the oxide film from the wafer surface. Then, the semiconductor wafer 8 is picked up from the treating bath 9 and transferred to the water rinse bath 10 filled with ultra-pure water in the successive semiconductor-cleaning section 2. The exposed Si on the oxide film-removed surface of wafer 8 is hydrophobic, but is in a highly active, readily impurities-adsorbable state in the course of the transfer. According to the present invention, the wafer 8 passes only through the inert gas 6 of high purity without any contact with the atmosphere containing impurities, and thus no adsorption of impurities takes place on the wafer surface. Then, the wafer 8 is dipped into the ultra-pure water in the water rinse bath 10 to dilute and remove the etching solution components completely from the wafer surface. Then, the wafer 8 is picked up from the ultra-pure water and transferred onto the wafer support 11 in the wafer-drying section 3. The wafer 8 picked up from the ultra-pure water in the water rinse bath 10 has a water film attached to the surface and is transferred also through the inert gas 6 of high purity without any contact with the atmosphere containing impurities. In this embodiment, the wafer surface turns hydrophobic after the oxide film removal, and the amount of the etching solution remaining on the wafer surface when the wafer 8 is picked up from the etching solution in the treating bath 9 is very small. That is, the remaining etching solution can be removed from the wafer surface by cleaning with the ultra-pure water for a short time, and thus the wafer surface can remain hydrophobic even after the wafer 8 is picked up from the ultra-pure water. In other words, the wafer surface is hydrophobic even after spin drying and is in a highly active, readily impurities-adsorbable state even in the successive step.

When such a wafer 8 is subjected to epitaxial growth of GaAs or ZnS thereon as a successive step, it is necessary to prevent the wafer surface from adsorption of impurities. The present invention is also effective for such a purpose. According to the present invention, the wafer 8 is transferred through the clean tunnel 4 filled with the inert gas 6 of high purity from the semiconductor drying section 3 to the epitaxial growth means in the successive section 5 after the drying. By providing a road lock chamber 13 at the inlet to the successive section 5 and filling an inert gas of high purity in the road lock chamber 13, no adsorption of impurities from the atmosphere can be made to take place on the wafer surface from the drying step as far as the epitaxial growth step. The thus obtained epitaxial growth region has distinguished crystallinity and electrical characteristics because of the absence of impurities at the interface between the wafer and the epitaxial growth region, and thus this can largely contribute to a decrease in the product failure ratio.

The embodiment shown in FIG. 1 is directed to a single wafer processing, but a batch processing can be also carried out in the present invention by using a plurality of wafers placed in a carrier made from, for example, Teflon.

In the present embodiment, drying is carried out on a spin table (support), but a vapor drying using commercially available isopropyl alcohol can be also used without any trouble. In the vapor drying, isopropyl alcohol is not in contact with the atmosphere containing impurities and is completely shielded with the inert gas of high purity, so that impurities are not dissolved in the isopropyl alcohol. That is, there is no risk of contamination of the wafer surface with impurities during the drying. In this embodiment, ultra-pure water and dilute hydrofluoric acid are exemplified as the treating solutions. A mixture of hydrofluoric acid and nitric acid, or organic solvents such as acetone, trichloroethane, etc. can be likewise used by keeping the space in a gas atmosphere of inert gas, etc. incapable of contaminating the treating solution, thereby keeping the high purity of wafer surface even during the wafer surface treatments.

Another embodiment of the present invention will be explained below, referring to application of the present invention to electrode formation after the contact hole formation and also referring to FIG. 1.

In FIG. 1, surface treatments can be carried out on a wafer support 11 with a spinning mechanism in the semiconductor drying section 3 by supplying a treating solution through a supply means 12 onto the wafer surface while spinning the wafer support 11 together with the semiconductor wafer 8 placed on the wafer support 11. The successive wafer surface-treating section 5 has a sputtering means for depositing a metallic film on the wafer surface. Between the semiconductor drying section 3 and the successive wafer surface-treating section 5 there is a transfer section 4 for transferring the wafer from the section 3 to the section 5.

In the process for producing Si-LSI, impurities at the interface between the wafer surface within the contact hole and the electrode metal often cause deterioration of the contact characteristics. The present invention is very effective for preventing contamination of the interface with impurities.

According to the present invention, a semi-conductor wafer 8 is placed on a wafer spin table (support) 11 in the semiconductor drying section 3 and an inert gas 6 of high purity is filled in the section 3. Then, dilute hydrofluoric acid of high purity is supplied to the wafer surface through the treating solution supply means 12, while supplying the inert gas 6 of high purity to the section 3, thereby to remove the oxide film in the contact hole. At the same time when the supply of the dilute hydrofluoric acid is discontinued, ultra-pure water is supplied thereon through the same treating solution-supplying means 12, while supplying the inert gas of high purity to the section 3, thereby to remove the remaining dilute hydrofluoric acid from the wafer surface. Then, at the same time when the supply of ultra-pure water is discontinued, the wafer spin table 11 is spun at a high speed, while supplying the inert gas of high purity to the section 3, thereby to scatter the remaining ultra-pure water from the wafer surface and dry the wafer surface. Ultra-pure water supplied to the wafer surface has a dissolved oxygen content of not more than about 100 ppb, which is obtainable by the process for producing ultra-pure water, and furthermore the cleaning purpose of ultra-pure water can be attained in such a short time as about 30 seconds. Thus there is neither formation of a natural oxide film [as reported in M. Kawakami and T, Ohmi: Shingaku Giho SDM89-4, p. 19 (1989)] nor contamination with impurities giving a large influence upon the contact characteristics within the contact hole. Then, the surface-treated wafer 8 is transferred to the next section 5 through the inert gas atmosphere, as shown in the foregoing first embodiment and inserted into a sputtering deposition means to deposit a metallic film thereon. The thus obtained wafer has neither a natural oxide film nor contamination with impurities at the interface between the semiconductor surface and the metallic film within the contact hole.

In this second embodiment of the present invention, drying of the wafer 8 is carried out by high speed spinning of the wafer spin table 11, where scattering of the treated solution (ultra-pure water) is principally utilized. However, it is also possible to utilize blowing of heated inert gas of high purity, irradiation of infrared rays in the inert gas atmosphere of high purity, etc. as an auxiliary means or as a principal means. Both single wafer processing and batch processing can be also applied to this second embodiment.

The inert gas used in the foregoing embodiments are commercially available inert gases of maximum purity, such as an impurity concentration of not more than 1 ppm or the inert gases whose impurity concentration is further reduced to not more than 10 ppb through a commercially available gas purifier. For example, an inert gas disclosed in M. Goto: Oyobutsuri (Applied Physics), Vol. 58, No. 6, pp. 947-948, (1989) can be used. An inert gas having a necessary minimum purity must be used in accordance with the desired purpose. Ultra-Pure water prepared in a commercially available system of most advanced type for producing ultra-pure water contains a very small trace amount of ions, particles, organic matter, silica, etc. and has a sufficient purity for the embodiments of the present invention.

As to the organic solvents, etc., commercially available ones having a maximum purity can attain the desired effect fully and it is rather important to prevent contamination with impurities from the atmosphere through their dissolution, as already mentioned in connection to the ultra-pure water.

Cross-sectional views of semiconductor Si wafer 8 in a series of these steps are shown in FIG. 2A to FIG. 2E.

Figure 2B:
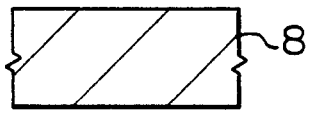
Figure 2C:
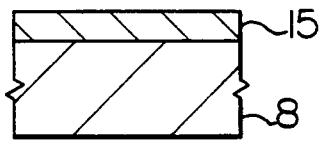
Figure 2D:
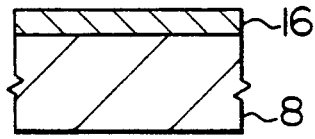
Figure 2E:
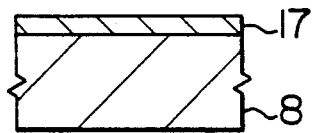

An oxide film 30 on a Si wafer 8, shown in FIG. 2A, is removed from the wafer 8 in the oxide film-removing section 1, and then the wafer surface is cleaned and dried without contamination of the wafer surface (FIG. 2B). Then, ZnS 15 is formed on the Si wafer 8 by epitaxial growth in a vapor phase epitaxial growth means in the successive section 5 (FIG. 2C). When the successive section 5 is directed to an electrode formation, an electrode film 16 such as a metallic film of Al or Au or a polycrystalline Si film is formed by the contamination-free Si wafer surface (FIG. 2D). When the section 5 is directed to a thin oxide film formation, a thin gate oxide film 17 is formed on the contamination-free Si wafer surface with good reproducibility (FIG. 2E).

Application of the present invention to electrode formation on a wafer surface after contact hole formation will be explained below, referring to FIGS. 3A and 3B An n+diffusion region 18 is formed on part of a surface of p-type, Si wafer 8. A contact hole 20 is formed through an insulator film 19 composed of an oxide film by a lithographic technique and an etching technique, and a photoresist (not shown in the drawing) is removed. According to the conventional process, the resist components or impurities in the resist, as remaining on the surface of the insulator film 19 after the removal of the resist, are removed by dipping the wafer 8 into an acid such as sulfuric acid, etc., followed by cleaning with ultra-pure water. A very thin oxide film 30 is formed on the n+diffusion region 18 in the contact hole 20, as shown in FIG. 3B, and thus no better contact characteristics are obtained even by forming a metallic film 16 as an electrode film on the very thin oxide film 30. That is, it is necessary to remove the oxide film 30 in the conventional film. However, in the conventional process, contamination with impurities or formation of oxides by natural oxidation in the atmosphere takes place within the contact hole, as already mentioned before, giving adverse effects upon the device characteristics, for example, poor contact, etc. in case of finer devices.

In this embodiment of the present invention, the space within the contact hole 20 is shielded by an inert gas of high purity from the removal of the oxide film 30 to the insertion of the wafer into a sputtering means for forming an electrode metal film through the cleaning with ultra-pure water and drying, and thus the space within the contact hole 20 can be prevented from any contact with the ultra-pure water contaminated with the atmosphere or even with the atmosphere itself, and accordingly can be prevented from adsorption of a impurities.

Figure 3A:
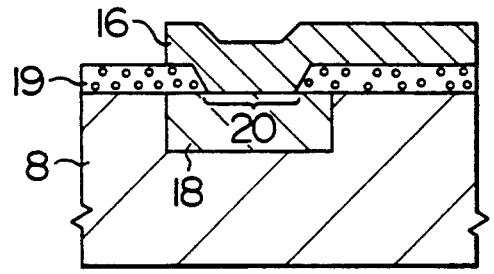
FIG. 3A shows semiconductor wafers or which an electrode formed or to be formed according to other embodiment the present invention in comparison with the prior art in FIG. 3B.
Figure 3B:
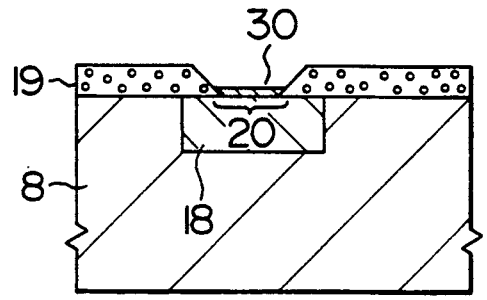

In other words, neither formation of natural oxide film nor contamination with impurities takes place at the interface between the n+diffusion region 18 and the electrode metal film 16 within the contact hole 20 on the semiconductor wafer 8 even by deposition of the electrode metal film 16, as shown in FIG. 3A, and stable and better contact characteristics can be obtained.

The present invention is very effective in many fields of application, for example, for improving the contact characteristics when an electrode is formed on the back side of a semiconductor laser, for improving the characteristics at the interface between the oxide film and Si when a capacity oxide film of high density DRAM is formed, or for improving the reliability of a thin gate oxide film for electron injection of EEPROM, etc.

The present invention can prevent contamination with impurities on the atomic level, and such effects as reduction in the crystal defect, decrease in the contact resistance, an improvement in the pressure resistance or reliability of a gate oxide film, etc. can be obtained by applying the present invention to epitaxial growth or electrode formation on a semiconductor wafer such as a Si wafer, etc., or to formation of a thin gate oxide film on a Si wafer, etc. That is, the present invention has various advantages such as improvements in the performance of large-scale integrated circuits, or semiconductor devices such as high speed devices, low noise devices, etc., production yield, etc.

What is claimed is:

1. A process for treating a semiconductor, comprising:

continuously maintaining a semiconductor substrate in an atmosphere of high purity inert gas while performing:

(a) a first step of treating a surface of said semiconductor substrate in an atmosphere of an inert gas of high purity including filling a first container with a surface-treating solution, covering a surface of said surface-treating solution in said first container with a high purity inert gas, and dipping said substrate into said solution in said first container to remove surface parts of said substrate;

(b) a second step of removing remaining surface-treating solution from said substrate in an atmosphere of inert gas of high purity including filling a second container with ultra-pure water, covering a surface of said ultra-pure water in said second container with a high purity inert gas, and subsequent to said dipping in step (a), dipping said substrate into said ultra-pure water in said second container; and (c) a third step of drying said substrate to remove ultra-pure water remaining thereon, said substrate being continuously kept in an atmosphere of inert gas of high purity in the first, second and third steps.

2. A process as in claim 1, wherein the third step comprises placing said substrate in an atmosphere of an alcohol vapor to replace ultra-pure water remaining on the substrate with the alcohol vapor and then removing the substrate from the atmosphere of alcohol vapor, while shielding the surface of the atmosphere of alcohol vapor with an atmosphere of inert gas of high purity.

* * * * *